United States Patent
Tseng

Patent Number: 5,716,882
Date of Patent: Feb. 10, 1998

[54] METHOD FOR FORMING A DRAM CAPACITOR BY FORMING A TRENCH IN A POLYSILICON LAYER

[75] Inventor: Horng-Huei Tseng, Hsinchu, Taiwan

[73] Assignee: Vanguard International Semiconductor Corp., Hsinchu, Taiwan

[21] Appl. No.: 739,130

[22] Filed: Oct. 28, 1996

[51] Int. Cl.⁶ .................................. H01L 21/8242
[52] U.S. Cl. ............................ 438/253; 438/595
[58] Field of Search ...................... 438/253, 254, 438/396, 397, 595, 596, 666

[56] References Cited

U.S. PATENT DOCUMENTS

| | | | |
|---|---|---|---|
| 3,387,286 | 6/1968 | Dennard | 438/239 |
| 5,508,223 | 4/1996 | Tseng | 438/253 |
| 5,534,457 | 7/1996 | Tseng et al. | 438/254 |

*Primary Examiner*—Chandra Chaudhari
*Attorney, Agent, or Firm*—Christensen O'Connor Johnson & Kindness PLLC

[57] ABSTRACT

An improved method for forming a dynamic random access memory (DRAM) capacitor with increased capacitance is disclosed. The method includes forming a polysilicon layer on a substrate, and forming a silicon nitride layer on the polysilicon layer. A photoresist layer is formed on the polysilicon layer to define a storage node area over the substrate surface. After a portion of the silicon nitride layer is removed using the photoresist layer as a mask, a polymer spacer is formed on the sidewalls of the photoresist layer and the silicon nitride layer. The polysilicon layer is removed using the polymer spacer and the photoresist layer as a mask. After the polymer spacer and the photoresist layer are removed, the polysilicon layer is subject to oxidation by using the silicon nitride layer as a mask, thereby forming a polysilicon-oxide layer on the sidewalls and the surface of the polysilicon not covered by the silicon nitride layer. The silicon nitride layer is stripped, and the polysilicon layer is etched using the polysilicon-oxide layer as a mask to form a trench in the polysilicon. Finally, the polysilicon-oxide layer is removed to form a bottom electrode of the capacitor of the dynamic random access memory.

19 Claims, 5 Drawing Sheets

5,716,882

METHOD FOR FORMING A DRAM CAPACITOR BY FORMING A TRENCH IN A POLYSILICON LAYER

FIELD OF THE INVENTION

The present invention relates to dynamic random access memory (DRAM) fabrication, and more particularly, to a method for forming a capacitor of the dynamic random access memory.

BACKGROUND OF THE INVENTION

Recently, demand for semiconductor devices has rapidly increased owing to widespread use of electronic equipment. In particular, the increasing popularity of electronic equipment such as computers is increasing the demand for large semiconductor memories.

FIG. 1 shows a simplified diagram of the topological organization of a typical large semiconductor memory 14. The storage cells of memory 14 are arranged in an array including horizontal rows and vertical columns. The horizontal lines connected to all of the cells in a row are called word lines 11, and the vertical lines connected to all of the cells in a column are referred to as bit lines 13. Data flow into and out of the cells via the bit lines.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18, respectively. The row decoder 16 and the column decoder 18 then respectively select the appropriate word line and bit line corresponding to the received address signal. The word and bit lines select a particular memory cell of the memory 14 corresponding to the received address signals. The row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells that consisted of three transistors and were manufactured using P-type metal-oxide-semiconductor (PMOS) technology. Later, U.S. Pat. No. 3,387,286 titled "FIELD EFFECT TRANSISTOR MEMORY" by R. H. Dennard disclosed a DRAM storage cell structure consisting of one transistor and one capacitor. A circuit schematic diagram of this structure is shown in FIG. 2A. The gate of the transistor 20 is controlled by a word line signal, and data represented by the logic level of a capacitor voltage, is written into or read out of the capacitor 22 through a bit line signal.

FIG. 2B shows a cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more densely integrated, the area occupied by a capacitor of a DRAM storage cell shrinks, thus decreasing the capacitance of the capacitor. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, which achieves both high cell integration and reliable operation.

One broad approach for increasing the capacitance of a capacitor while maintaining the high integration of the storage cells is directed toward varying the shape of the capacitor electrodes. In this approach, the polysilicon layer implementing the capacitor electrodes may have protrusions, fins, cavities, etc., to increase the surface area of the capacitor electrode, thereby increasing its capacitance while maintaining the small area occupied on the substrate surface. Consequently, this type of capacitor has come to be widely used in DRAM devices.

SUMMARY OF THE INVENTION

A method is provided for forming a DRAM capacitor that substantially increases capacitance. In one embodiment, a MOSFET is conventionally formed in and on a semiconductor substrate. Next, a stack oxide/silicon nitride layer is then formed atop the MOSFET. A polysilicon layer is deposited using a conventional low pressure chemical vapor deposition (LPCVD) process. After planarization of the polysilicon layer, via use of an etch back or other conventional planarization method such as chemical mechanical polishing (CMP), a silicon nitride layer is deposited using a conventional low pressure chemical vapor deposition (LPCVD) process or a plasma-enhanced chemical vapor deposition (PECVD) process.

Conventional photolithography techniques are then used to define a storage node area in a photoresist layer formed on the silicon nitride layer. Using the photoresist layer as a mask, the silicon nitride layer is etched, via use of a heated solution of phosphoric acid, $H_3PO_4$. A plasma gas such as $CHF_3$ is then reacted with the photoresist layer to form non-volatile polymer spacers on the sidewalls of the photoresist layer and the silicon nitride layer. Because the forming of the polymer spacers is done in the same chamber as the application of the photoresist, time and cost is substantially reduced.

Using the polymer spacers on the sidewalls of the photoresist layer and the silicon nitride layer as an etching mask, the polysilicon layer is dry etched using a conventional reactive ion etch (P/E) etchant, such as $Cl_2$+HBr and $SF_6$+$O_2$. After the polymer spacers and the photoresist layer are conventionally removed, the polysilicon layer is subject to thermal oxidation at about 800°–900° C., using the silicon nitride mask as a mask. Consequently, the polysilicon layer grows a polysilicon-oxide layer at the sidewalls and the surface of the polysilicon layer.

The silicon nitride layer is removed via use of a heated solution of phosphoric acid, $H_3PO_4$. The polysilicon layer is then etched using the polysilicon-oxide layer as a mask by a RIE process, resulting in a trench structure in the polysilicon layer. After the polysilicon-oxide layer is etched in a buffered or diluted HF solution, a thin dielectric layer, such as a stacked oxide-nitride-oxide (ONO) film, is formed on the surface of the polysilicon layer and the stack oxide/silicon nitride layer. The ONO is reliable over the shaped silicon surface, and is typically used as a capacitor insulator. A conductive layer is then deposited over the stack oxide/silicon nitride layer as a cell plate of the capacitor formed in the dynamic random access memory.

DETAILED DESCRIPTION

Figure 1:
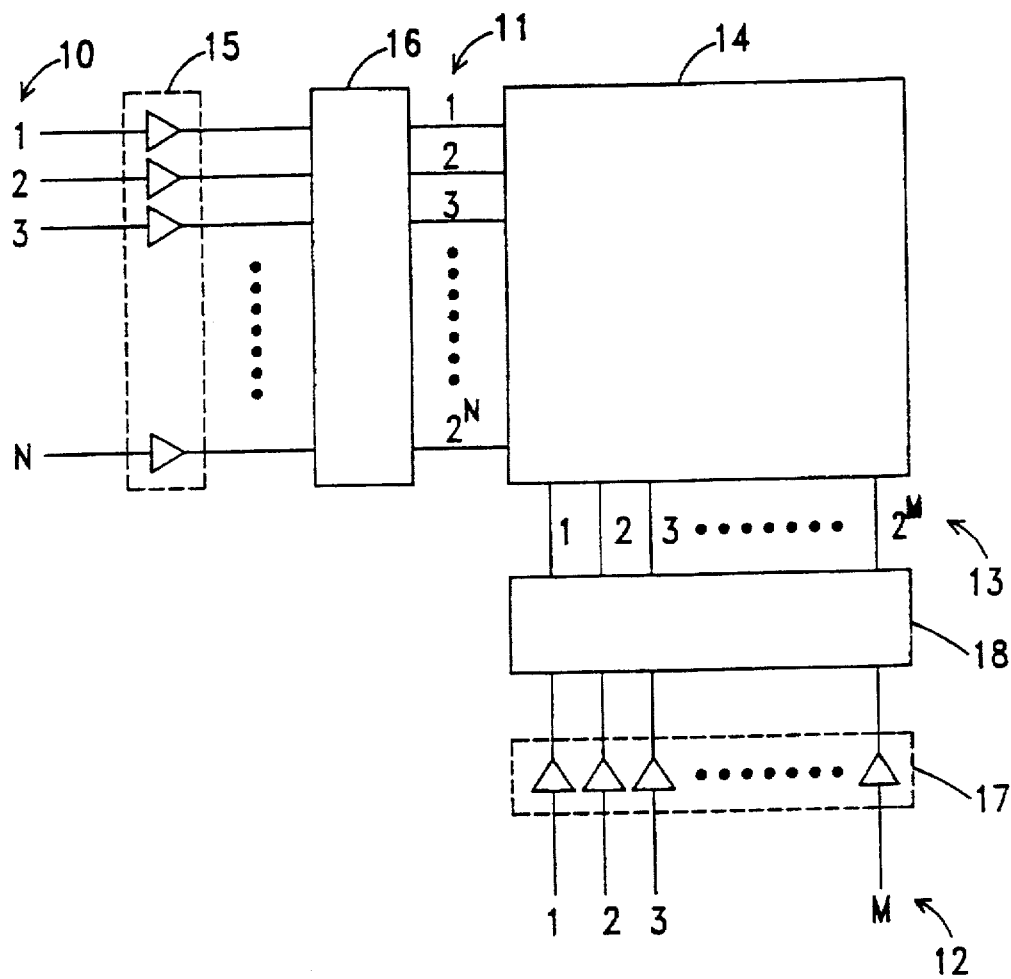
FIG. 1 shows a simplified diagram of the organization of prior art large semiconductor memories.
Figure 2A:
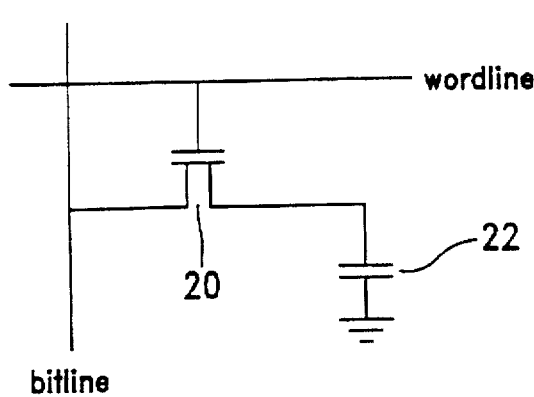
FIG. 2A shows a circuit schematic diagram of a prior art dynamic random access memory (DRAM)
Figure 2B:
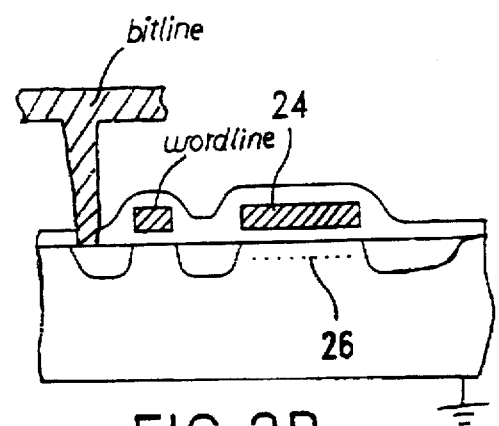
FIG. 2B shows cross section of a prior art one-transistor DRAM storage cell.
Figure 3:
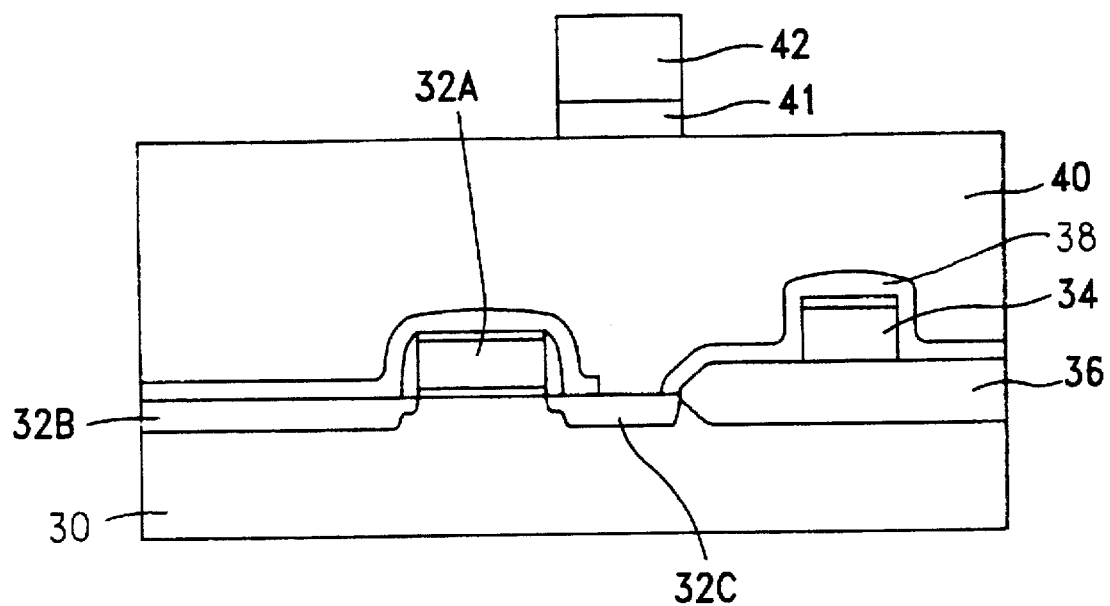
FIGS. 3–9 show cross-sectional views illustrative of various stages in the fabrication of a DRAM capacitor in accordance with one embodiment of the present invention.

Referring to FIG. 3, a MOSFET having a gate 32A, a drain 32B and a source 32C, is conventionally formed in and on a substrate 30. A word line 34 is formed over a field oxide (FOX) region 36. Typically, the word line 34 is made of doped polysilicon. Further, a stack oxide/silicon nitride layer 38 is formed typically to a thickness of about 800 to 2000 angstroms. In this embodiment, the MOSFET is a n-channel MOSFET that forms part of a dynamic random access memory (DRAM) cell. The formation of such a MOSFET is well known in the art.

A polysilicon layer 40 is deposited using a conventional low pressure chemical vapor deposition (LPCVD) process by the decomposition of silane at about 550°–650° C. at a pressure of about 0.2–0.1 torr. The thickness of the polysilicon layer 40 can be about 3000 to 8000 angstroms.

After planarization of the polysilicon layer 40, via use of an etch back or other conventional planarization method such as chemical mechanical polishing (CMP), a silicon nitride layer 41 is deposited using a conventional low pressure chemical vapor deposition (LPCVD) process or a plasma-enhanced chemical vapor deposition (PECVD) process. The thickness of the silicon nitride layer 41 can be about 300 to 1000 angstroms.

Conventional photolithography techniques are then used to define a storage node area in a photoresist layer 42 formed on silicon nitride layer 41. Using the photoresist layer 42 as a mask, the silicon nitride layer 41 is etched, via use of a heated solution of phosphoric acid, $H_3PO_4$.

Figure 4:
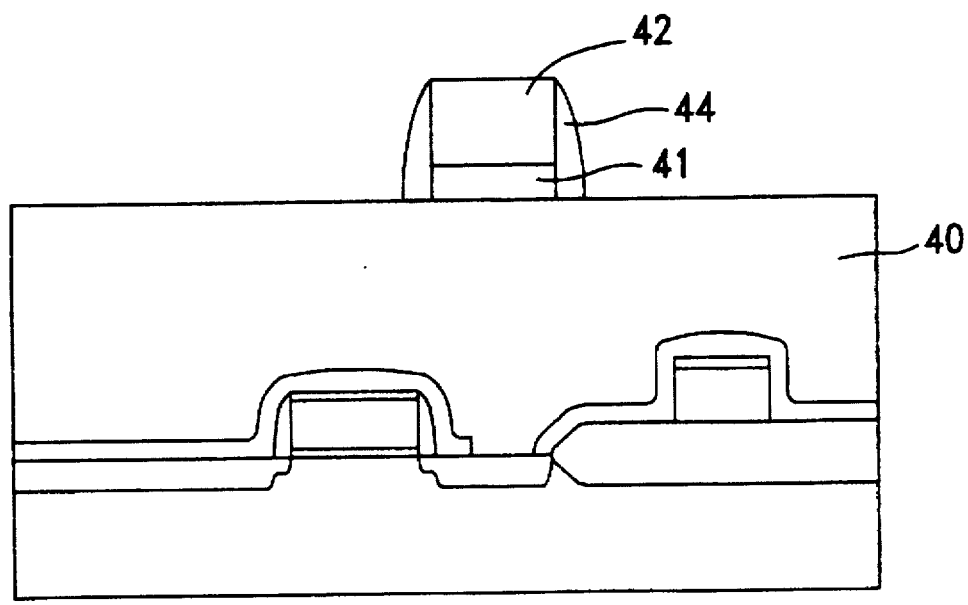

Referring to FIG. 4, a plasma gas such as $CHF_3$ and HBr is then reacted with the photoresist layer 42 to form non-volatile polymer spacers 44 on the sidewalls of the photoresist layer 42 and the silicon nitride layer. Because the forming of the polymer spacers 44 is done in the same chamber as the previous application of photoresist 42, time and cost is substantially reduced. In this embodiment, the polymer spacers has a width of about 0.05 to 0.15 μm.

Figure 5:
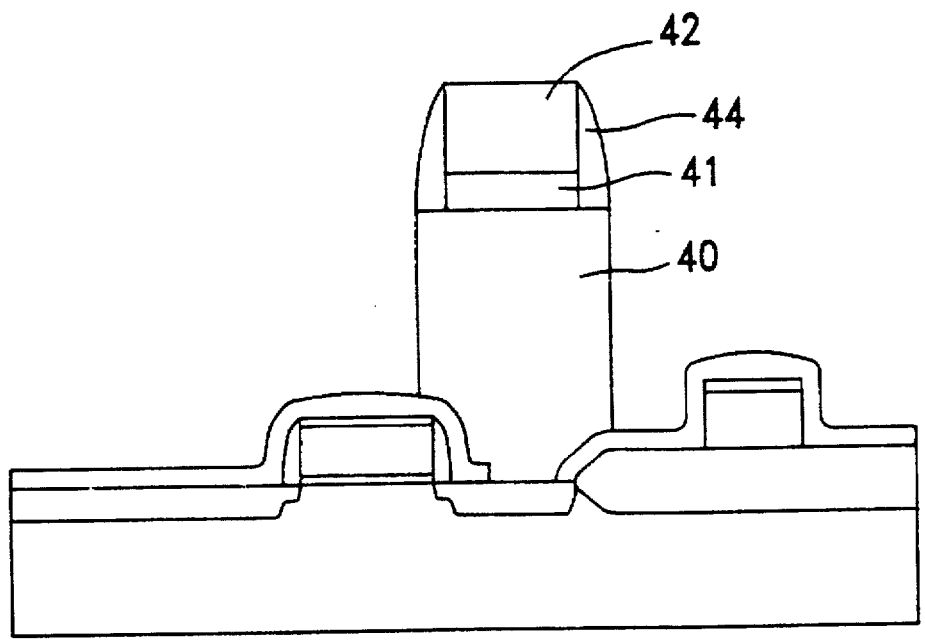

Using the polymer spacers 44 on the sidewalls of the photoresist layer 42 and the silicon nitride layer 41 as an etching mask, the polysilicon layer 40 is dry etched, as shown in FIG. 5, using a conventional reactive ion etch (RIE) etchant such as $Cl_2$+HBr and $SF_6$+$O_2$.

Figure 6:
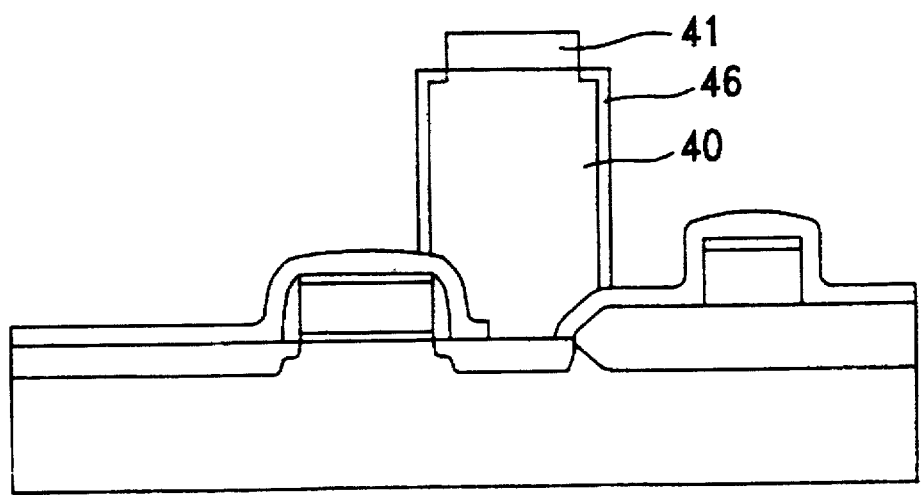

Referring to FIG. 6, after the polymer spacers 44 and the photoresist layer 42 are conventionally removed, the polysilicon layer 40 is subjected to a thermal oxidation at about 800°–900° C., using the silicon nitride mask 41 as a mask. Consequently, the polysilicon layer 40 grows a polysilicon-oxide layer 46 to a thickness of about 200 to 800 angstroms at the sidewalls and the surface of the polysilicon layer 40.

Figure 7:
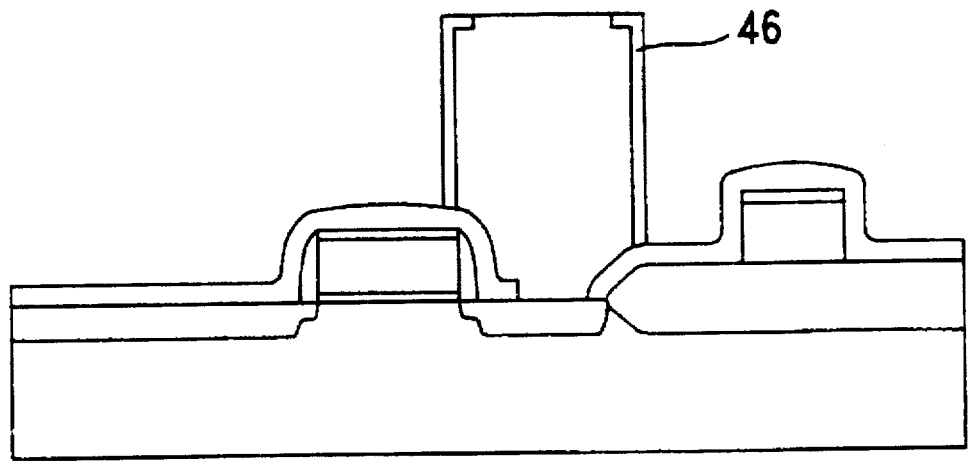
Figure 8:
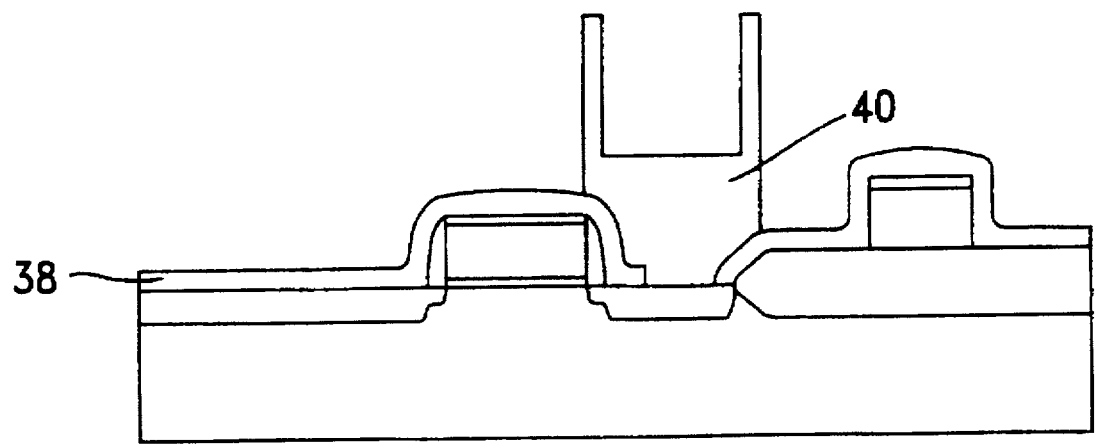

FIG. 7 shows the resultant structure after the silicon nitride layer 41 is removed via use of a heated solution of phosphoric acid, $H_3PO_4$. The polysilicon layer 40 is etched using the polysilicon-oxide layer 46 as an etch mask by a reactive ion etching process, resulting in the trench structure shown in FIG. 8. The depth of the trench is about 2000 to 6000 angstroms. Owing to the large surface of the trench, the capacitance of the capacitor is substantially increased. The polysilicon-oxide layer 46 is then etched in a buffered or diluted HF solution.

Figure 9:
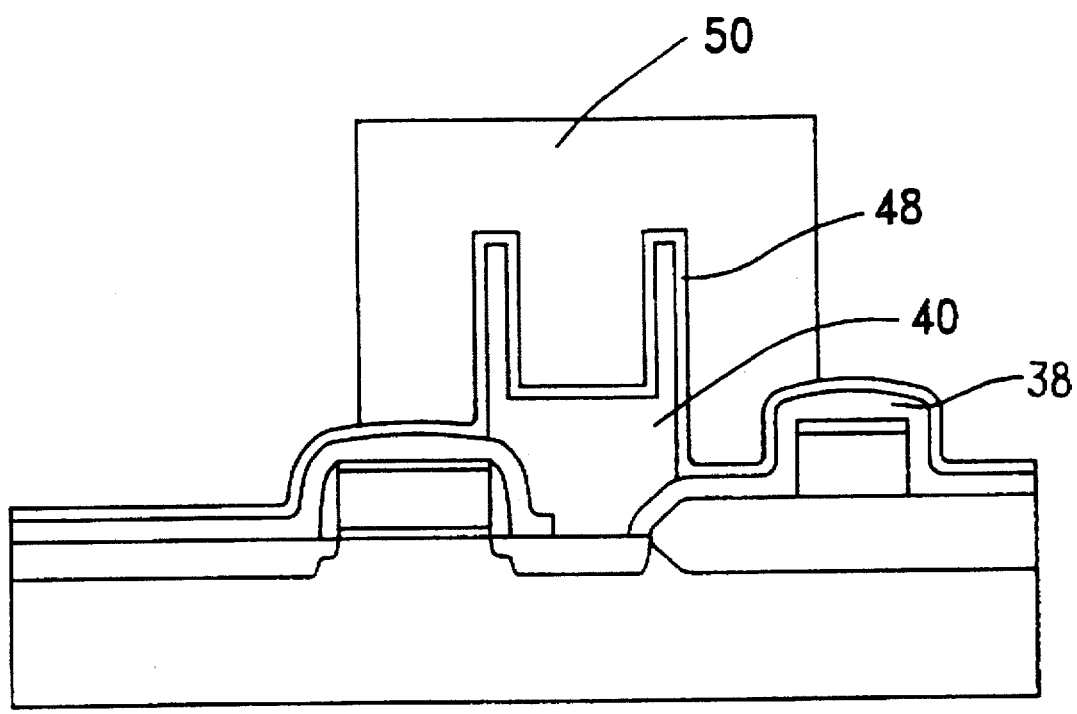

Referring to FIG. 9, a thin dielectric layer 48, such as a stacked oxide-nitride-oxide (ONO) film, is formed on the surface of the polysilicon layer 40 and the stack oxide/silicon nitride layer 38. The ONO is reliable over the shaped silicon surface, and is typically used as a capacitor insulator. The bottom oxide layer of the stacked oxide-nitride-oxide (ONO) film 48 is conventionally formed by thermally oxidizing the silicon surface, depositing a LPCVD silicon nitride layer and then oxidizing the silicon nitride layer to form the top oxide layer. Finally, a conductive layer 50 is deposited over the stack oxide/silicon nitride layer 38 as a cell plate of the capacitor formed in the dynamic random access memory.

Although specific embodiments have been illustrated and described, it will be obvious to those skilled in the art that various modification may be made without departing from the spirit which is intended to be limited solely by the appended claims.

The embodiments of the invention in which an exclusive property or privilege is claimed are defined as follows:

1. A method for forming a capacitor of a dynamic random access memory, said method comprising the steps of:

forming a polysilicon layer on a substrate having a structure formed thereon;

forming a silicon nitride layer on the polysilicon layer;

forming a photoresist layer on the polysilicon layer, said photoresist layer defining a storage node area over a portion of the substrate surface;

removing a portion of said silicon nitride layer using the photoresist layer as a mask;

forming a non-volatile polymer spacer on the sidewalls of said photoresist layer and said silicon nitride layer and performed in the same chamber as said step of forming a photoresist layer;

removing said polysilicon layer using the polymer spacer and the photoresist layer as a mask;

removing said polymer spacer and said photoresist layer;

oxidizing said polysilicon layer using the silicon nitride layer as a mask, thereby forming a polysilicon-oxide layer on the sidewalls and the surface of the polysilicon not covered by the silicon nitride layer;

removing said silicon nitride layer;

removing a portion of said polysilicon layer using the polysilicon-oxide layer as a mask to form a trench in the polysilicon; and removing said polysilicon-oxide layer, thereby forming a bottom electrode of the capacitor of the dynamic random access memory.

2. The method according to claim 1, wherein said structure formed on the substrate comprises a metal-oxide-semiconductor transistor, said metal-oxide-semiconductor transistor being a part of the dynamic random access memory.

3. The method according to claim 1, further comprising the step of planarizing said polysilicon layer.

4. The method according to claim 1, wherein the depth of said trench in the polysilicon layer is about 2000 to 6000 angstroms.

5. The method according to claim 1, wherein thickness of said polysilicon layer is about 3000 to 8000 angstroms.

6. The method according to claim 1, wherein the thickness of said polysilicon-oxide layer is about 200 to 800 angstroms.

7. The method according to claim 1, further comprising the step of forming a dielectric layer on the surface of the bottom electrode of the capacitor.

8. The method according to claim 7, further comprising the step of forming a conductive layer over the dielectric layer, thereby forming a cell plate of the capacitor.

9. The method according to claim 7, wherein said dielectric layer comprises a stacked oxide-nitride-oxide (ONO) layer.

10. The method according to claim 1, wherein said polymer spacer is formed by reacting a plasma gas with the photoresist layer.

11. A method for forming a capacitor of a dynamic random access memory, said method comprising the steps of:

forming a polysilicon layer on a substrate;

forming a silicon nitride layer on the polysilicon layer;

forming a photoresist layer on the polysilicon layer, said photoresist layer defining a storage node area over a portion of the substrate surface;

removing a portion of said silicon nitride layer using the photoresist layer as a mask;

forming a dielectric spacer on the sidewalls of said photoresist layer and said silicon nitride layer in the same chamber as said step of forming a photoresist layer;

removing said polysilicon layer using the dielectric spacer and the photoresist layer as a mask;

removing said dielectric spacer and said photoresist layer;

oxidizing said polysilicon layer using the silicon nitride layer as a mask, thereby forming a polysilicon-oxide layer on the sidewalls and the surface of the polysilicon not covered by the silicon nitride layer;

removing said silicon nitride layer;

removing a portion of said polysilicon layer using the polysilicon-oxide layer as a mask to form a trench in the polysilicon; and removing said polysilicon-oxide layer, thereby forming a bottom electrode of the capacitor of the dynamic random access memory.

12. The method according to claim 11, further including the step of planarizing said polysilicon layer.

13. The method according to claim 11, wherein the depth of said trench in the polysilicon layer is about 2000 to 6000 angstroms.

14. The method according to claim 11, wherein the thickness of said polysilicon layer is about 3000 to 8000 angstroms.

15. The method according to claim 11, further comprising the step of forming a dielectric layer on the surface of the bottom electrode of the capacitor.

16. The method according to claim 15, further comprising the step of forming a conductive layer over the dielectric layer, thereby forming a cell plate of the capacitor.

17. The method according to claim 15, wherein said dielectric layer comprises a stacked oxide-nitride-oxide (ONO) layer.

18. The method according to claim 11, wherein said dielectric spacer is a non-volatile polymer spacer.

19. The method according to claim 18, wherein said polymer spacer is formed by reacting a plasma gas with the photoresist layer.

* * * * *